United States Patent [19]

Tanaka

[11] 4,322,628
[45] Mar. 30, 1982

[54] PHOTO-ELECTRIC COUPLING DEVICE

[75] Inventor: Toshiaki Tanaka, Yokohama, Japan

[73] Assignee: Tokyo Shibaura Denki Kabushiki Kaisha, Japan

[21] Appl. No.: 97,640

[22] Filed: Nov. 27, 1979

[30] Foreign Application Priority Data

Dec. 19, 1978 [JP] Japan .................. 53-155808

[51] Int. Cl.³ .............................. G02B 27/00
[52] U.S. Cl. ..................... 250/551; 357/19
[58] Field of Search ............ 250/227, 551; 357/19

[56] References Cited

U.S. PATENT DOCUMENTS

| | | | |
|---|---|---|---|
| 3,893,158 | 7/1975 | Lincoln | 357/19 |
| 4,047,045 | 9/1977 | Paxton et al. | 357/19 |
| 4,125,777 | 11/1978 | O'Brien et al. | 357/19 |
| 4,136,351 | 1/1979 | Sugawara et al. | 250/551 |

*Primary Examiner*—David C. Nelms
*Attorney, Agent, or Firm*—Finnegan, Henderson, Farabow, Garrett & Dunner

[57] ABSTRACT

A photo-electric coupling device has a semiconductor light-emitting element and light-responsive element, the latter element receiving directly and approximately perpendicularly light emitted from the light-emitting element through its active edge including an edge of a P-N junction thereof. The light-responsive element and the light-emitting element are mounted on free-end portions of respective leads bent about 45° out of a planar lead frame whereby a plane defined by the free-end portion carrying the light-responsive element is approximately perpendicular to a plane defined by the other free-end portion.

12 Claims, 3 Drawing Figures

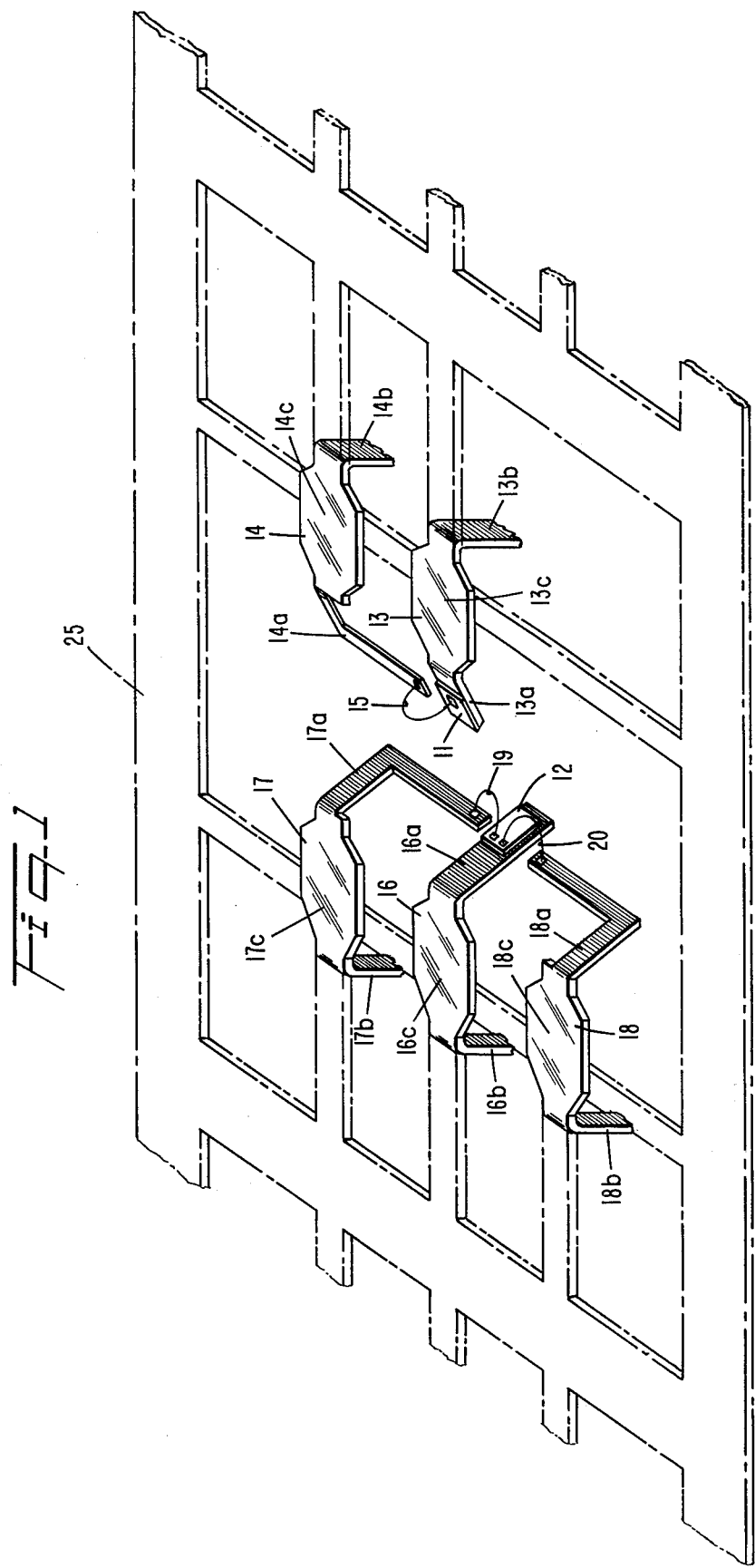

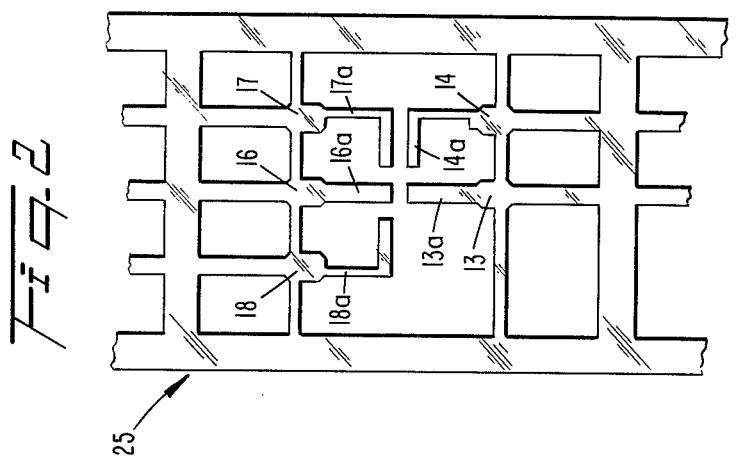
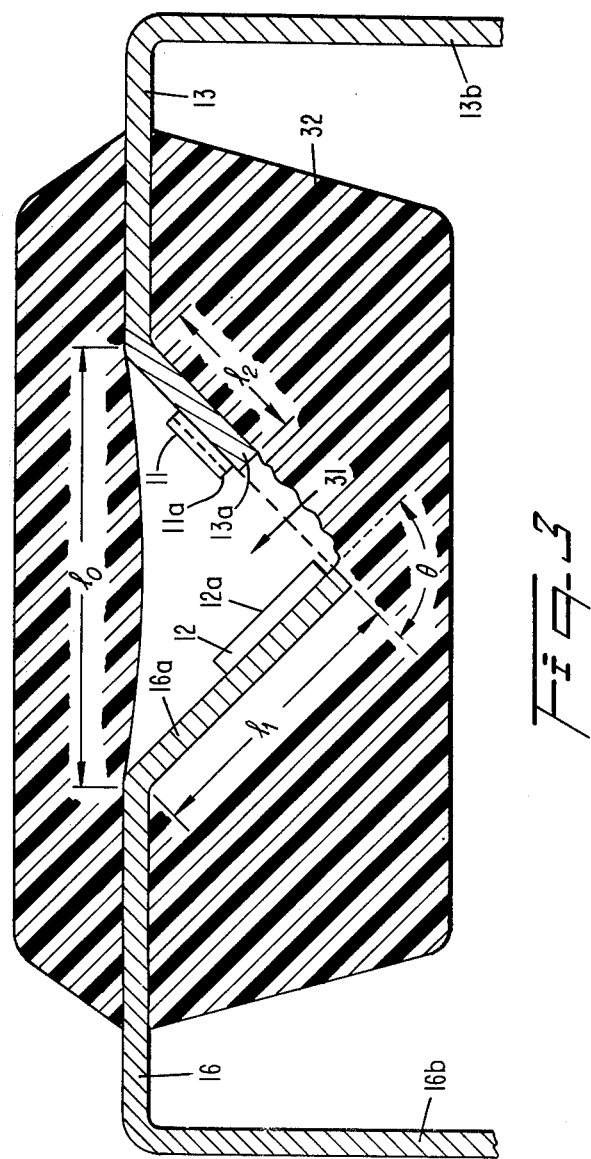

PHOTO-ELECTRIC COUPLING DEVICE

BACKGROUND OF THE INVENTION

This invention relates to photo-electric coupling devices and more particularly to an improvement in the arrangement of the elements of photo-electric coupling devices for greater efficiency of manufacturing and better utilization of the light coupling between the light-emitting element and the light-responsive element.

In a typical arrangement of photo-electric coupling devices, a pair of electrodes or leads, of strip-like shape, face each other in a parallel plane relationship. Mounted on one of these leads on the surface facing the other lead is a light-emitting element, while a light-responsive element is mounted on the other lead such that the light-sensitive surface thereof faces the light-emitting element. At least two other leads are individually electrically connected to electrode portions in the opposing surfaces of the elements preferably by means of wire-bonding.

Since a certain amount of space is required for inserting the working head of a wire-bonding machine, it is impossible to perform wire-bonding while the leads carrying the individual elements are disposed in the customary final arrangement. In the conventional manufacturing procedure, therefore, it is necessary first to place the leads to receive the individual elements in positions accessible by the wire-bonding machine and then, after wire-bonding, to bend the leads individually into the final arrangement of opposing surfaces.

To obtain good photo-electric coupling efficiency, accurate positioning of these elements is required so that the positioning of the leads for wire-bonding, and repositioning of the leads, after the wire bonding, are troublesome and relatively expensive steps in manufacturing.

The typical arrangement of the light-emitting element and the light-responsive element of a photo-electric coupling device referred to, presents a further problem. A light-emitting diode (L.E.D.) is customarily utilized as the light-emitting element in a photo-electric coupling device. An L.E.D., as well-known, is a semiconductor device fabricated of alternating layers of P and N materials. Light is developed at the junctions of the juxtaposed layers and the primary light paths are outwardly through the edges of the diode and not through the major opposing surfaces of the diode.

In the conventional arrangement of a photo-electric coupling device, a major surface of the light-emitting diode is positioned opposite the light-sensitive surface of the light-responsive element. The light emitted from the edges of the L.E.D. must, therefore, be reflected by some means into the sensitive surface of the light-responsive element. In U.S. Pat. No. 4,054,801, for example, this is accomplished by making the opposing sides of the body enclosing the space between the elements arcuate and lining the surfaces of the opposing inner surfaces of the body with reflective material for focusing the light onto the light-sensitive surface of the light-responsive element.

SUMMARY OF THE INVENTION

Accordingly, it is one object of this invention to improve photo-electric coupling devices for increased efficiency of manufacturing.

Another object of this invention is to provide a photo-electric coupling device having good photo-electric coupling characteristics, while having improved efficiency in manufacture.

It is a further object of the invention to utilize more efficiently the light coupling between an L.E.D. and the light-responsive element in a photo-electric coupling device.

The objects of the invention are achieved by a photo-electric coupling device comprising: a light-emitting element, a first electrical lead carrying the light-emitting element, first means for enabling the light-emitting element to be energized, the first means including an electrode portion mounted on one surface of said light-emitting element opposite said first lead, a light-responsive element having a light-sensitive surface and being disposed such that at least a portion of the light emitted from a surface of the light-emitting element different from said one surface impinges approximately perpendicularly upon the light-sensitive surface, a second electrical lead carrying the light-responsive element, second means for enabling said light-responsive element to develop an electrical signal responsive to light emitted from the light-emitting element, and a protective housing of non-light transmissive material substantially surrounding said light-emitting and light-responsive elements while leaving a light-transmissive space therebetween.

BRIEF DESCRIPTION OF THE DRAWINGS

This invention may be more fully understood from the following detailed description with reference to the accompanying drawings, wherein:

FIG. 1 shows a perspective view of a preferred embodiment of this invention, prior to encapsulation and includes a portion of the lead frame in phantom line;

FIG. 2 shows a plan view of a lead frame used for the embodiment of FIG. 1; and

FIG. 3 shows a cross-sectional view of an encapsulated photo-electric coupling device according to the invention.

Throughout these FIGURES, corresponding or identical parts or portions are indicated by the identical reference numerals.

DETAILED DESCRIPTION OF PREFERRED EMBODIMENT

Referring now to FIG. 1, a light-emitting element, such as a light-emitting diode 11, and a light-responsive element such as, for example, a photo-transistor 12 are positioned in such relation that the light-sensitive surface of the photo-transistor 12 faces an active edge of the light-emitting diode 11. The light-emitting diode 11 is mounted on, and electrically connected to, a primary lead 13 at a bent elongated portion 13a such that a P-N junction of light-emitting diode 11 is parallel to the surface of the portion 13a. An actuating lead 14 has a bent arm portion 14a, the free end thereof being electrically connected to the light-emitting diode 11 through an electrode on its upper surface through a fine wire 15, preferably by using the wire-bonding technique. The light-emitting diode 11 can be energized through the leads 13 and 14.

The photo-transistor 12 is mounted on, and electrically connected by, the collector thereof to a primary lead 16 at a bent elongated portion 16a such that the light-sensitive surface of the photo-transistor 12 is parallel to the surface of the portion 16a. Actuating leads 17 and 18, each having bent arm portions 17a and 18a, are electrically connected to the base portion and emitter portion of the photo-transistor 12, through fine wires 19 and 20, respectively, preferably also by using the wire-bonding technique.

The leads 13, 14, 16, 17 and 18 have portions 13a, 14a, 16a, 17a, and 18a, already referred to, extending from respective base portions 13c, 14c, 16c, 17c and 18c, and bent at respective inner edges of the base portions. The leads 13, 14, 16, 17 and 18 also have respective exterior pin portions 13b, 14b, 16b, 17b, and 18b extending from respective base portions of the leads. In order that the light-sensitive surface of the photo-transistor 12 faces the active edge of the light-emitting diode 11, the longitudinal length of the portion 16a carrying the photo-transistor 12 is longer than that of the portion 13a carrying the light-emitting diode 11, as shown more clearly in FIG. 3. The length $l_1$ of the bent portion 16a relative to the length $l_2$ of the bent portion 13a is a function to the length of the light-sensitive surface 12a of the photo-responsive device 12, and the angle at which the plane determined by the element-carrying surface of the bent portion 13a intersects with the element-carrying surface of the bent portion 16a.

For ease of manufacturing, as explained in more detail hereinafter, it is preferred that the plane of the element-carrying surface of the portion 13a be substantially tangent to the outer surface of the free end of the bent portion 16a. It is also preferred that the light-responsive element 12 be mounted adjacent the free end of the portion 16a. The active edge of the light-emitting element 11, preferably an L.E.D., will then be aligned substantially with the outer end of the light-responsive element 12 adjacent the free end of the portion 16a.

It is preferred that the length of the light-sensitive surface 12a and the relative position of the active edge of the L.E.D. be such that the field of light flow from the active edge of the L.E.D. encompasses the full length of the light-sensitive surface of the light-responsive device 12, preferably a photo-transistor as stated above.

It is apparent that the angle of the bent portion 13a, with respect to the base portion 13c, may be adjusted as convenient for most effective light-coupling in conjunction with efficiency of fabricating the coupling device. It is also apparent that the plane of the element-carrying surface of the portion 13a may intersect the light-sensitive surface of the photo-transistor 12a along its length, as desired.

The leads 13, 14, 16, 17 and 18 are preferably made from a single planar metal thin plate, shown in phantom lines in FIG. 1, and as lead frame 25 in FIG. 2. The portions 13a, 14a, 16a, 17a, and 18a are then bent out of the plane by around 45° as understood from FIG. 1. That is, an imaginary plane containing the bent portion 13a is preferred to be approximately perpendicular to an imaginary plane containing the bent portion 16a. The photo-transistor 12 and the light-emitting diode 11 are then mounted, the major surface of the elements being approximately mutually perpendicular. It is apparent that the elements 11, 12 may be attached to the portions 13a, 16a while these portions are still the plane of the lead frame 25, if desired, rather than after the portions 13a, 16a have been bent out of the plane of the frame.

FIG. 3 shows a cross-sectional view of the completed device wherein the electrical connections for the photo-diode 12 through the wires 19 and 20, and the electrical connections for the light-emitting diode 11 through the wire 15 are omitted for simplicity.

A light-transmissive medium 31, as known in the art, is interposed in the space formed by imaginary planes containing the portions 13a and 16a and the plane of the lead frame 25. The assembly is then encapsulated in a protective housing 32 of light non-transmissive material, as known in the art. Thus, the housing 32 keeps the leads 13, 14, 16, 17 and 18 in predetermined positions. Exterior pin portions 13b, 14b, 16b, 17b and 18b of the leads 13, 14, 16, 17 and 18 are formed as necessary, for use of the device, by separation of the respective leads from the lead frame 25.

For ease of accurate positioning of the element-carrying bent portions 13a and 16a the lead frame 25 are designated under the condition:

$$l_0 > l_1 + l_2$$

wherein $l_0$ is the distance between bent corners of 13a and 16a; $l_1$ the length from the bent corner of 16a to the free end thereof; and $l_2$ the length from the bent portion of 13a to the free end thereof.

In manufacturing, the planar lead frame 25 is prepared having primary leads 13 and 16 and actuating leads 14, 17 and 18 and also having bridge portions such as for connecting the base portions of leads 13 and 14 to keep the latter leads in position. Then the portions 13a, 14a, 16a, 17a and 18a are bent about 45° out of the plane on the same side of the lead frame 25 so that a plane defined by portions 13a and 14a is approximately perpendicular to a plane defined by portions 16a, 17a, and 18a.

Next, the photo-transistor 12 and the light-emitting element 11 (L.E.D.) are mounted for electrical connection to the portions 16a and 13a respectively, in the following relation. The photo-transistor 12 is so mounted that the plane of its light-sensitive surface is substantially parallel with the surface of the portion 16a on which the transistor 12 is mounted. The light-emitting element 11 is mounted such that its P-N junction is substantially in a plane parallel with the surface on which it is mounted and that light emitted from its active edge, including an edge portion of the P-N junction, impinges directly and substantially perpendicularly on the light-sensitive surface 12a of the photo-transistor 12.

A head of a wire-bonding machine is brought into the space defined by the bent lead portions along a direction substantially parallel with the lead portion 13a to make electrical connections between actuating lead portions 17a and 18a and the electrode portions of the photo-transistor 12.

Then, the head of the wire-bonding machine is brought along a direction substantially parallel with the lead portion 16a to make electrical connection between actuating lead 14a and the electrode portion of the light-emitting diode 11 in the plane major surface parallel with the lead portion 13a. The electrical connections for photo-transistor 12 made at the previous stage do not interfere with performing this stage, because the electrical connections for photo-transistor 12 occupy only space near a corner defined by a plane including 16a, 17a and 18a, and a plane including 13a and 14a.

It is apparent that it is immaterial to the invention whether the light-emitting element and the light-responsive element are attached before or after the lead portions 13a and 16a are bent. Neither is it material as to the sequence in which the wires 15, 19 and 20 are interconnected to the elements and the actuating leads.

Afterward, the light-transmissive material portion 31 is formed and then encapsulation 32 is made, in the manner known in the art.

Thus, a photo-coupling device with improved ease of manufacturing and excellent light coupling can be obtained. No reflective material lining the cavity of the housing 32 is required.

In operation, upon energization, the light-emitting element 11 emits light through an active edge which impinges directly on the light-sensitive surface of the photo-transistor 12. Of the several known kinds of light-emitting diodes, diodes of the type of gallium phosphide (GaP), which emits red light, and of the type of gallium arsenide (GaAs), which emits ultra red light, are preferred. The P and N semiconductor materials of the light-emitting elements of these types are themselves transmissive with respect to the light emitted from the P and N junctions. Thus, the light strength impinging directly on the light-sensitive surface of the light-responsive element 12 is supplemented by the light emitted through the major exposed surface of the light-emitting diode 11.

It is effective to increase the photo-coupling characteristics that the active edge portion 11a of the light-emitting element 11 is disposed in a plane approximately parallel with the light-sensitive surface 12a, because the efficiency of a photo-transistor is proportional substantially to the cosine of the angle between the direction of incident light and the line normal to the sensitive surface 12a. That is, the angle between bent elongated portions 13a and 16a should be approximately 90° for highest efficiency. Then at least a portion of the light emitted through the active edge 11a impinges directly and approximately perpendicularly on the light-sensitive surface 12a of the photo-transistor 12. Thus, a photo-electric coupling device having good photo-electric characteristics can be obtained.

Although described above is a certain preferred embodiment, there may be many modifications or changes within the scope of the appended claims or within the spirit of this invention. For example, as for the light-responsive element, a photo-diode, a photo-thyristor or a similar semiconductor device may be employed.

What is claimed is:

1. A photo-electric coupling device comprising:
   a light-emitting element;
   a first electrical lead having a first planar elongated portion carrying said light-emitting element;
   first means, in cooperation with said first lead, for enabling said light-emitting element to be energized, said first means including an electrode portion mounted on one surface of said light-emitting element opposite said first lead;
   a light-responsive element having a light-sensitive surface and being disposed such that at least one portion of the light emitted from a surface of the light-emitting element different from said one surface impinges approximately perpendicularly upon said sensitive surface;
   a second electrical lead having a second planar elongated portion carrying said light-responsive element;
   second means for enabling said light-responsive element to develop an electrical signal responsive to light emitted from said light-emitting element; and
   a protective housing of non-light transmissive material substantially surrounding said light-emitting and light-responsive elements, while leaving a light-transmissive space therebetween;
   said first lead having a first base portion from which said first elongated portion extends, and
   said second lead having a second base portion disposed in a co-planar relation with said first base portion, said second elongated portion extending from said second base portion;
   said first and second elongated portions being bent out of the plane of the base portions at respective edges of the base portions, said first and second elongated portions both being bent to the same side of said plane;
   the second elongated portion being longer than said first elongated portion and disposed approximately perpendicularly to an imaginary plane containing said first elongated portion.

2. A photo-electric coupling device according to claim 1, wherein said light-emitting element is a light-emitting diode.

3. A photo-electric coupling device according to claim 1, wherein said light-emitting element is a light-emitting diode of gallium phosphide type.

4. A photo-electric coupling device according to claim 1, wherein said light-emitting element is a light-emitting diode of gallium arsenide type.

5. A photo-coupling device according to claim 1, wherein said light-responsive element is a photo-transistor.

6. A method for assembling a photo-electric coupling device comprising:
   providing a planar lead frame having first and second opposing free-end primary leads, said first primary lead being shorter than said second primary lead, and each of the opposing free end primary leads having associated therewith free-end actuating leads;
   bending said opposing primary leads and respective actuating leads about 45° out of said lead frame on the same side of the frame, the plane defined by one of said opposing primary leads and its associated actuating lead or leads thereby being perpendicular to the plane defined by the other of the opposing primary leads and its associated actuating lead or leads;
   attaching a light-emitting element and a light-responsive element to said first and second primary leads, respectively, each of said elements having at least one electrode on a planar major face thereof opposite the attached primary lead, the planes of said planar electrode-bearing faces thus being approximately perpendicular to each other and an edge of said light-emitting element being directly opposite said major face of said light-responsive element;
   bringing a head of a wire-bonding machine into the approximate right angle between said planar electrode-bearing faces for interconnecting said electrodes with the associated actuating leads by wire-bonding technique; and
   encapsulating said light-emitting element and said light-responsive element and at least a portion of the attached leads in non-light transmissive material, while leaving a light-transmissive space between said light-emitting element and said light-responsive element.

7. A method for assembling a photo-electric coupling device comprising:

provinding a planar lead frame having a pair of opposing free-end primary leads and each of the opposing free-end primary leads having associated therewith free-end actuating leads;

bending said opposing primary leads and respective actuating leads about 45° out of said lead frame on the same side of the frame, the plane defined by one of said opposing primary leads and its associated actuating lead or leads thereby being perpendicular to the plane defined by the other of the opposing primary leads and its associated actuating lead or leads;

attaching a light-responsive element having at least one electrode on a planar major light-sensitive face thereof to one of said free-end primary leads, said at least one electrode being on the side of said light-responsive element opposite to its attached lead;

bringing a head of a wire-bonding machine into a space defined by imaginary planes containing said free-end primary leads along a direction substantially parallel with the other of said free-end primary leads for interconnecting said electrode or electrodes with the actuating lead or leads associated with said one of said free-end primary leads to which said light-responsive element is attached;

attaching a light-emitting element having at least one electrode on a planar major face thereof to said other of said free-end primary leads, an edge of said light-emitting element thereby being directly opposite said major light-sensitive face of said light-responsive element and said at least one electrode of said light-emitting element being on the opposite side of said latter element from its attached free-end primary lead, the planes of said planar electrode-bearing faces being approximately perpendicular to each other;

bringing the head of the wire-bonding machine into said space along a direction substantially parallel with said one of said free-end primary leads to which said light-responsive element is attached for interconnecting said electrode or electrodes of said light-emitting element with the actuating lead or leads associated with said other of said free-end primary leads to which said light-emitting element is attached; and encapsulating said light-emitting element and said light-responsive element and at least a portion of the attached leads in non-light transmissive material, while leaving a light-transmissive space between said light-emitting element and said light-responsive element.

8. A method for assembling a photo-electric coupling device comprising:

providing a planar lead frame having first and second opposing free-end primary leads, said first primary lead being shorter than said second primary lead and each of the opposing free-end primary leads having associated therewith free-end actuating leads, attaching a light-emitting element and a light-responsive element to said first and second primary leads respectively, each of said elements having at least one electrode on a planar major face thereof opposite the attached primary lead;

bending said opposing primary leads and their respective associated actuating leads about 45° out of said lead frame on the same side of the frame, a plane defined by one of said opposing primary leads and its associated actuating leads thereby being perpendicular to the plane defined by the other of the opposing primary leads and its associated actuating leads, whereby an edge of said light-emitting element is opposite said major light-sensitive face of the light-responsive element;

bringing the head of a wire-bonding machine into the approximate right angle between said planar electrode-bearing faces for interconnecting said electrodes with the associated actuating leads by wire-bonding technique; and encapsulating said light-emitting element and said light-responsive element and at least a portion of the attached leads in non-light transmissive material, while leaving a light-transmissive space between said light-emitting element and said light-responsive element.

9. A photo-electric coupling device comprising:

a light-emitting element;

a first planar electrical lead carrying said light-emitting element;

first means, in cooperation with said first lead, for enabling said light-emitting element to be energized, said first means including an electrode portion mounted on one surface of said light-emitting element opposite said first lead;

a light-responsive element having a light-sensitive surface and being disposed such that at least one portion of the light emitted from a surface of the light-emitting element different from said one surface impinges approximately perpendicularly upon said sensitive surface;

a second planar electrical lead disposed perpendicularly to said first planar lead carrying said light-responsive element;

second means for enabling said light-responsive element to develop an electrical signal responsive to light emitted from said light-emitting element; and a protective housing of non-light transmissive material substantially surrounding said light-emitting and light-responsive elements, while leaving a light-transmissive space therebetween.

10. A photo-electric coupling device as in claim 9, wherein said first and second planar leads each comprise a thin metal plate.

11. A photo-electric coupling device as in claim 9 wherein the light emitted from said light-emitting element impinges on substantially all of said light-sensitive surface of said light-responsive element.

12. A photo-electric coupling device comprising:

a light-emitting element;

a first electrical lead carrying said light-emitting element;

first means, in cooperation with said first lead, for enabling said light-emitting element to be energized, said first means including an electrode portion mounted on one surface of said light-emitting element opposite said first lead;

a light-responsive element having a light-sensitive surface and being disposed such that at least one portion of the light emitted from a surface of the light-emitting element different from said one surface impinges approximately perpendicularly upon the entire area of said sensitive surface;

a second electrical lead carrying said light-responsive element;

second means for enabling said light-responsive element to develop an electrical signal responsive to light emitted from said light-emitting element; and a protective housing of non-light transmissive material substantially surrounding said light-emitting and light-responsive elements, while leaving a light-transmissive space therebetween.

* * * * *